United States Patent [19]

Glaser et al.

[11] 4,242,638
[45] Dec. 30, 1980

[54] CIRCUIT FOR MONITORING THE SQUARE OF THE RMS VALUE OF A PERIODIC SIGNAL

[75] Inventors: Helmut Glaser, Forchheim; Ludwig Schick, Erlangen, both of Fed. Rep. of Germany

[73] Assignee: Siemens Aktiengesellschaft, Berlin and Munich, Fed. Rep. of Germany

[21] Appl. No.: 24,513

[22] Filed: Mar. 28, 1979

[30] Foreign Application Priority Data

Apr. 7, 1978 [DE] Fed. Rep. of Germany ....... 2815089

[51] Int. Cl.³ .................... G01R 19/02; G01R 21/06; G06G 7/16
[52] U.S. Cl. .................................. 328/144; 328/127; 328/151; 328/160; 324/132; 307/229
[58] Field of Search .............. 328/144, 160, 151, 127; 307/229, 230; 324/132

[56] References Cited

U.S. PATENT DOCUMENTS 3,911,359  10/1975  Metcalf ............................... 328/144

FOREIGN PATENT DOCUMENTS 2314870  10/1974  Fed. Rep. of Germany ........... 328/144

Primary Examiner—Stanley D. Miller, Jr.
Assistant Examiner—B. P. Davis
Attorney, Agent, or Firm—Kenyon & Kenyon

[57] ABSTRACT

A circuit arrangement for monitoring the square of the RMS value of a periodic signal in which an integrator following a squarer is reset to zero at periodic intervals. A first limit detector connected thereto delivers, if the limit set therein is exceeded, a pulse which is fed, via a first conjunctive logic element, to the counting input of a counter. The counter delivers a continous signal to an indicator and to the first conjunctive logic element when a preset counter reading is reached. A gate circuit blocks the periodic resetting of the counter as long as the first limit detector responds in each periodic time interval or when the preset counter reading is reached. This circuit permits quick determination of the RMS value.

8 Claims, 3 Drawing Figures

CIRCUIT FOR MONITORING THE SQUARE OF THE RMS VALUE OF A PERIODIC SIGNAL

BACKGROUND OF THE INVENTION

1. Field of the Invention

This invention relates to a circuit arrangement for monitoring the square of the RMS value of a periodic signal by means of a squaring element connected to an integrating element.

2. Discussion of the Prior Art

The equation for defining the square of the RMS value of a periodic signal u reads $$u_{eff}^2 = \frac{1}{T} \int_0^T u(t)^2 \, dt;$$

i.e., the square of the RMS value is equal to the quotient of the integral of the square of the periodic signal taken over one cycle and the period T.

A circuit arrangement for measuring the RMS value of an AC voltage is described in German Auslegeschrift No. 1,935 544, in which squaring of the AC voltage is accomplished by supplying it to the two inputs of a multiplier, the output of which is connected to an integrator. The output variable of the integrator corresponding to the RMS value is fed, via a coupling element, to a dividing input of the multiplier. Such a circuit arrangement is relatively sluggish, so that it is not suitable for rapid monitoring whether the RMS value exceeds a limit in time spans comparable to the period of the periodic signal.

German Offenlegungsschrift No. 2 314 870 describes a circuit arrangement for measuring the square of the RMS value of periodic voltages or currents in which the periodic signal is fed to a squarer. The output signal of the squarer is sampled at equi-distant time intervals within a period, and the instantaneous values present at the instant of sampling are measured by fast voltage-frequency converters and are fed to a counter. Thus, a kind of numerical integration of the square of the periodic signal is performed during each period. This circuit arrangement furnishes a signal proportional to the square of the RMS value at the end of each period and thus works very fast. However, it requires not inconsiderable circuitry.

It is an object of the present invention to describe a circuit arrangement of the kind mentioned above, which provides an indication of when the square of the RMS value in successive periods of a periodic signal exceeds a limit a presettable number of times.

SUMMARY OF THE INVENTION

The problem set forth above is solved in the present invention by means of the following:

(a) An integrator which is reset to zero at periodic intervals by synchronizing pulses from a timer (clock) spaced apart by a period of the periodic signal;

(b) the integrator is followed by a first limit detector which delivers a pulse when its limit is exceeded by the output signal of the integrator;

(c) the output of the first limit detector is connected via a first conjunctive logic element to the counting input of a counter which delivers, upon reaching a present count, a continuous signal to an indicator unit which is activated thereby, and to the first conjunctive logic element; and (d) reset pulses are fed to the reset input of the counter at the rate of the synchronizing pulses of the timer via a gate circuit which blocks delivery of the reset pulses as long as the first limit detector delivers a pulse at every periodic time interval, or when the preset count in the counter is reached.

The timer normally delivers a synchronizing pulse at the beginning or at the end of a period of the periodic signal whose squared RMS value is being monitored, which resets the output voltage of the integrator, corresponding to the squared RMS value, to zero; the integrator is then ready for the next measuring cycle. The presence of the integrator enables the squared RMS value of the current or the voltage to be measured independently of the waveform of the periodic signal. The magnitude of the square of the RMS value determined between two respective synchronizing pulses is monitored in a first limit detector. When the limit is exceeded, a pulse-shaped signal is generated which is picked up in the counter. If the limit is exceeded between two synchronizing pulses in a monitoring cycle, an indicator is activated when the counter reaches a predetermined count. When the preset count level is reached, the counter input is blocked by a preceding conjunctive logic element. If, after a sequence of limit transgressions which is smaller, however, than the level preset in the counter, a monitoring cycle occurs in which the limit is not exceeded, the counter is reset to zero by a reset pulse delivered, in this case, to the reset input of the counter from the gate preceding the reset input. An open electric switch serves as a gate and blocks the passage of the synchronizing pulses, which here serve as reset pulses, when the first limit detector delivers a pulse in every periodic time interval or when the predetermined count is reached.

The circuit arrangement can be constructed at moderate cost from commercially available components. This circuit arrangement, on the one hand, furnishes an indication sufficiently quickly when the limit is exceeded in a few successive cycles or half-cycles of the periodic signal. On the other hand, through a suitable choice of the number of successive limit transgressions, it is possible to gate out a lower number of limit transgressions such as may occur, for instance, when an AC control element is switched on.

In the case of periodic signals produced by phase gating an AC voltage, the timer delivers a synchronizing pulse at each zero crossing of the AC voltage. Therefore, the squared waveform of the periodic signal repeats in each half-cycle and the synchronizing pulses of the timer occur at the end of each of these periods. The square of the RMS value is thus made immediately available at the integrator output at the end of each half-period and before the resetting. Voltage and current waveforms of this kind occur, for instance, in final AC control elements operated by phase gating. Faster monitoring is thus made possible.

In a preferred embodiment of the invention, every pulse generated by the first limit detector persists for the time that the limit is exceeded. The gate circuit comprises a JK storage member and a second conjunctive logic element. The synchronizing pulses of the timer are present at the clock input of the JK storage member. The limit detector signal which is present at the input of a first AND gate is fed, via an inverter, to the enable input on the reset side of the JK storage member, and directly, to the enable input on the setting side of the JK storage member. The output associated with the setting side of the JK storage member is connected to an inverting input of the second conjunctive logic element and the clock, to the other input; the output of the second conjunctive logic element constitutes the output of the gate circuit. The gate circuit is, therefore, constructed from a logic element and a storage element; it prevents the counter from being reset as long as the limit is exceeded by the squared RMS value once in every monitoring cycle between two respective synchronizing pulses, or if the preset counter level is reached.

It is advantageous to connect the output of the squarer to a second limit detector, the output of which, together with the output of the first limit detector, is fed to a disjunctive logic element, the output of which is, in turn, connected to the first conjunctive logic element. This provides peak-value monitoring of the squared periodic signal, so that the counter content can be increased by a sequence of output signals of the squarer having an amplitude so high that its integral would not cause a response of the first limit detector because the duration of the signals is too short and so that an indication takes place when the predetermined counter reading is exceeded and overloading of the squarers is detected.

It is also advantageous to connect a third limit detector, the threshold of which is above that of the first limit detector, to the output of the integrator and, when the third limit indicator responds, to trigger a pulse generator connected thereto. The repetitive output signals of this pulse generator, which have a considerably higher frequency than the synchronizing pulses are fed to another input of the first conjunctive logic element. In this way, when the squared RMS value exceeds the limit by an extreme amount, not only one pulse, but a large number of pulses, is fed to the counter in this monitoring cycle, so that the preset counter reading is reached in the same cycle and the indicating unit is activated.

In a particularly simple and inexpensive embodiment, the pulse generator is an astable multivibrator.

In one preferred embodiment, an operational amplifier, having an integrating capacitor bridged between its inverting input and its output, serves as the integrator, and an electronic switch connected in parallel to the integration capacitor is closed by the synchronizing pulses of the timer. The electronic switch short-circuits the integration capacitor for the duration of a synchronizing pulse so that the capacitor is completely discharged at the end of the pulse.

It is advantageous to implement a series circuit consisting of a third limit detector and the pulse generator by using an operational amplifier, the output of which is fed back to both inputs, via a series-connected diode and resistor into each input and in which the inverting input is tied, via a further resistor, to the output of the integrator and, via a capacitor, to ground. The noninverting input of the amplifier is connected, via a resistor, to a negative reference potential and the associated resistors are proportioned so that, when the capacitor has been charged, a larger positive voltage is present at the inverting input than at the noninverting input. Thus, the function of the third limit detector can be realized with a few components by means of the astable multivibrator which is connected thereto and is triggered when the third limit indicator responds.

DETAILED DESCRIPTION OF THE INVENTION

Figure 2:
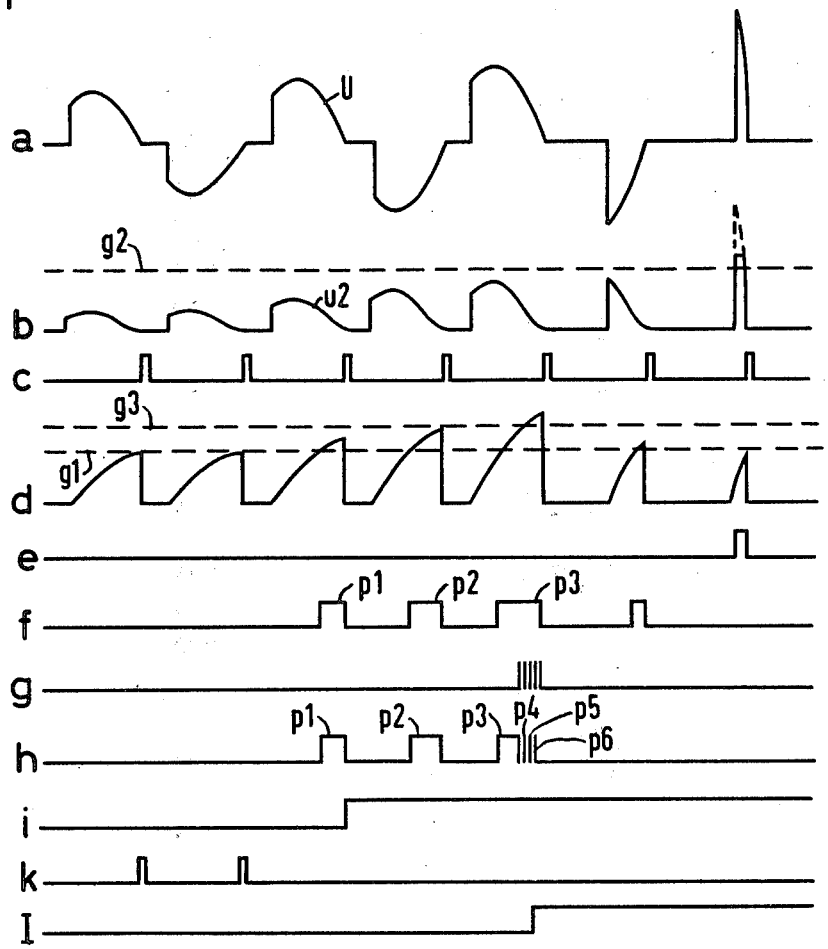
FIG. 2 is a chart of the signals appearing at various points in the circuit of FIG. 1.

In the illustrative embodiment, the output voltage u of an AC control element, which accomplishes voltage control by phase gating, is supplied as the periodic signal to be monitored. The signal u is fed to both inputs of multiplier 1, which thus operates as a squarer. The waveforms of input voltage u and of the output voltage $u_2$ of the multiplier 1 are shown in FIG. 2 on lines a and b. The output signal $u_2$ of multiplier 1 is fed to integrator 2 which is also fed, at its resetting input, with the output signal of timer 3. Timer 3 finishes short synchronizing pulses at the beginning of each half-cycle of the periodic signal u (line c of FIG. 2). If the periodic input signal does not have a zero crossing after every half-cycle, then a timer having output pulses spaced by a full cycle of the periodic signal is used. In general, it is not necessary, in phase-gate controlled converters, to use a separate timer for deriving synchronizing pulses from the zero crossings of the supplying AC voltage, since the synchronizing pulses are already generated in the control unit of the converter. Comparison of the curves in FIG. 2 at a and c shows delivery of the synchronizing pulses at every zero crossing of the supplying AC voltage. It should be noted that the synchronizing pulses of timer 3 are also fed to the clock input of a JK storage member forming part of a gate circuit to be described later.

The amplitude of the output signal of integrator 2 produced between two successive synchronizing pulses defining a monitoring period is proportional to the square of the RMS value to be monitored. The output signal of integrator 2, shown on line d in the pulse diagram of FIG. 2, is supplied to the input of limit detector 6 which, when the input signal exceeds a level designated g1 in FIG. 2, delivers an output pulse having a duration corresponding to the length of time the limit is exceeded. This can be seen in FIG. 2 by comparing waveforms d and f, the output signal of limit detector 6 being shown on line f. An output signal, such as p1 in FIG. 2 which occurs when the limit level g1 is exceeded, passes subsequently through disjunctive logic element 7 and a first conjunctive logic element 8 connected thereto, and finally is delivered to the counting input of a counter 9 as the signal p1 shown on line f for causing the counter, assuming that it had previously been reset to zero, to show a reading of one (1). As long as the counter reading remains below a preset value (in the present example, a counter reading of six), a null signal appears at the counter output. The null output of the counter is brought to an inverting input of first conjunctive logic element 8 permitting the output pulses from limit indicator 6 to pass through logic element 8 until the preset counter reading is reached. A null signal is also present, at the moment under consideration, at another inverting input of first conjunctive logic element 8 as the output signal of a pulse generator 10. The AND condition for the first conjunctive logic element 8 is thus fulfilled.

The operation and design of gate circuit 5 will now be described. The synchronizing pulses of timer 3 are fed to the reset input of counter 9 via second conjunctive logic element 11. At the same time, the synchronizing pulses are fed to the clock input of the JK storage element 4. The output of OR gate 7 is fed, via inverter 12, to enable input J on the reset side of JK storage element 4, and directly to the enable input K associated with the setting side of the JK storage element. The output $\overline{Q}$ on the setting side of JK storage element 4 is connected to an inverting input of second conjunctive logic element 11. The output of counter 9 is also connected to setting input S of JK storage element 4.

When the appearance of a first signal p1 at the output of limit detector 6 indicates a voltage exceeding the limit, JK storage element member 4 is transferred into the setting state at the instant of arrival of a synchronizing pulse from timer 3 at clock input T of the storage element. A 1-signal is therefore present at output Q on the setting side (curve i of FIG. 2). For the duration of this condition of the JK storage member, the transmission of reset pulses to the reset input of counter 9 is prevented by second conjunctive logic element 11. If the limit of detector 6 is not exceeded during the next monitoring cycle, the JK storage element is reset by the next reset pulse. The AND condition at second conjunctive logic element 11 is then fulfilled when a synchronizing pulse arrives and counter 9 is reset to zero.

However, as shown in FIG. 2 it is here assumed that the limit g1 of the limit detector 6 is exceeded in the next monitoring period by a second pulse p2, as shown on line f. This pulse passes disjunctive logic element 7 as well as first conjunctive logic element 8 and increases the count content of counter 9 to 2, since gate circuit 5 has remained blocked and counter 9 could not be reset. If, now, the limit of detector 6 is exceeded in each of the next four successive monitoring cycles, the content of counter 9 will rise to the preset value 6, and a 1-signal will be generated at the output of counter 9 as shown in FIG. 2, line 1. This counter output signal activates an indicator unit 13 which, in the illustrative example, for the sake of simplification is shown as an incandescent lamp. Simultaneously, this output signal of counter 9 cancels the AND condition of first conjunctive logic element 8, which had been fulfilled until then. Thus, no further signal can reach the counting input of counter 9 and the counter reading is not increased further. In addition, due to the presence of the 1-signal output of counter 9 at setting input S of JK storage element 4, the "set" state of the storage element is established. Thereby, second conjunctive logic element 11 in the gate circuit 5 blocks the resetting of counter 9.

A second limit detector 14 whose output is connected to the second input of disjunctive logic element 7, is connected to the output of squarer 1. Second limit detector 14 monitors the amplitude of the squared voltage signal u as to whether a second limit g2 is exceeded (see FIG. 2, line b). This second limit g2 is just under the overload limit of squarer 1. When the limit g2 is exceeded, the content of counter 9 is increased by one unit (see line e in FIG. 2). Amplitude monitoring of the input signal u is thus provided so that a reliable indication is also given of the occurrence of a continuous sequence of input signals u of very large amplitude which have so short a duration that the integral of the "spikes" does not exceed the limit g1 of limit detector 6. This is shown in FIG. 2 by means of the voltage signal farthest to the right on lines a, b, c, d and e.

A third limit detector 15 is connected to the output of integrator 2. The limit g3 of limit detector 15 is higher than the limit g1 of parallel-connected limit detector 6. If the output signal of integrator 2 also exceeds the limit of third limit detector 15, an astable multivibrator or pulse generator 10 is set in operation by the detector output signal, and the train of pulses so generated, shown in FIG. 2 on line g, is fed to an inverting input of first conjunctive logic element 8.

If, during a monitoring period, the output signal of integrator 2 (FIG. 2, line d), exceeds not only the limit g1 of first limit detector 6 but also the limit g3 of third limit detector 15, a pulse pattern whose frequency is high, compared to the frequency of the synchronizing pulses, is delivered by pulse generator 10 along with the signal p3 delivered by first limit detector 6 when the excursion beyond the limit g3 began, is fed, via first conjunctive logic element 8, to the counting input of counter 9. This signal flow is shown in FIG. 2 on lines g and h. The frequency of the pulse generator may be, for instance, about 3 kHz. As also shown in FIG. 2 on line h, the necessary set of six pulses for causing the counter to reach its limit is attained, in the illustrative example, well within the duration of the excursion beyond the limit g1. Therefore counter 9 generates an output signal (line 1 in FIG. 2), and an indication by indicating unit 13 takes place. As already explained above, the activation of the output signal of counter 9 prevents counter 9 from further counting by cutting off first conjunctive logic element 8 and prevents the resetting of counter 9 by blocking gate circuit 5. The monitoring circuit consisting of limit indicator 15 and pulse generator 10 ensures that the preset counter reading is reached very fast in counter 9 and, thereby, indication is given in the event of an extremely high output signal of integrator 2 which exceeds both limits g1 and g3.

Figure 1:
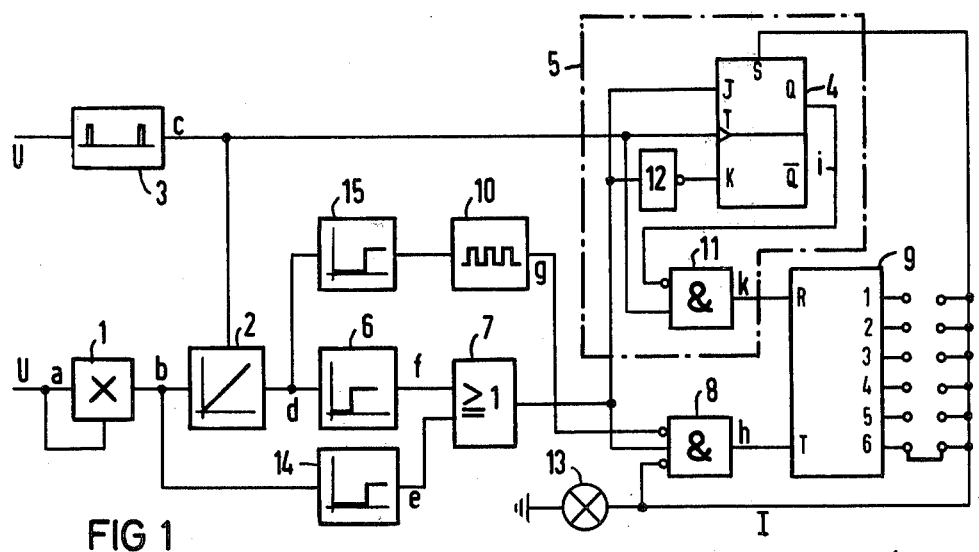
FIG. 1 is a block diagram of a circuit arrangement for monitoring the square of an RMS value of a periodic signal in accordance with the teachings of the invention.
Figure 3:
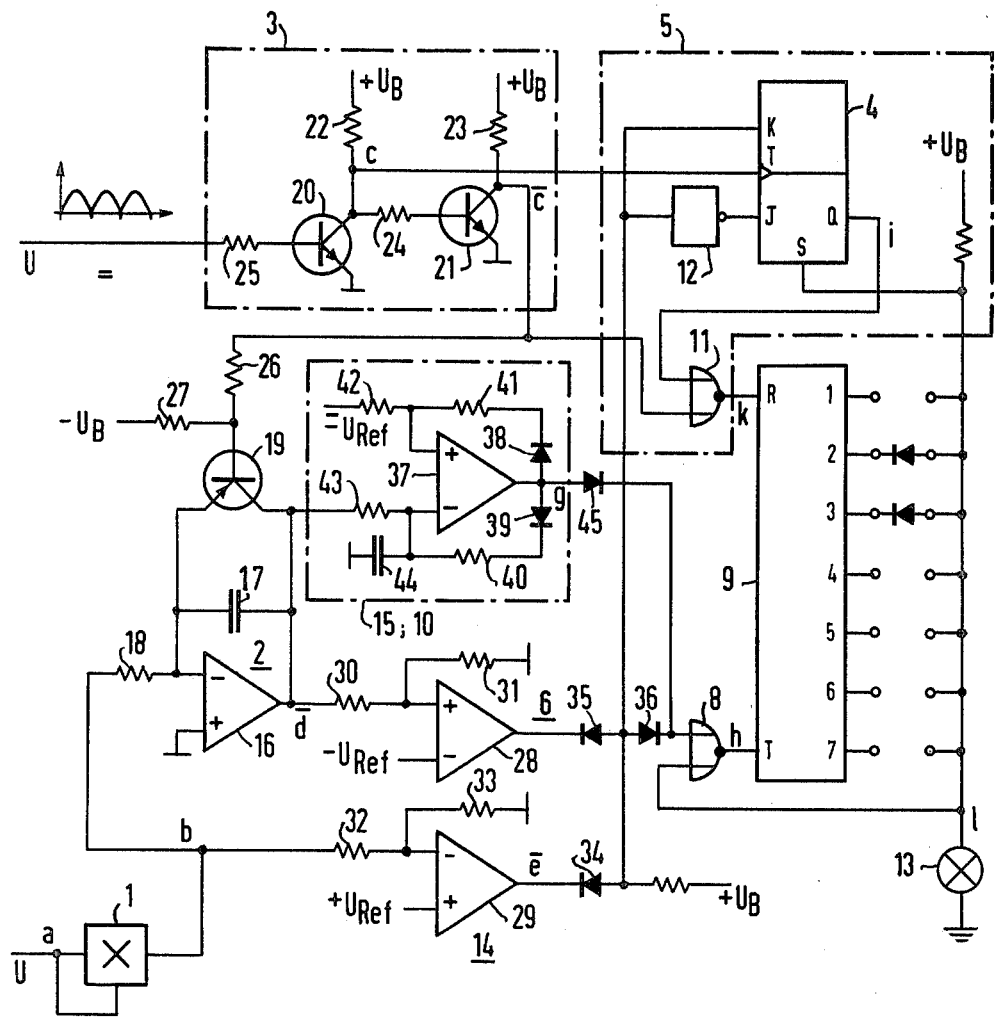
FIG. 3 is a schematic diagram showing details of an illustrative implementation of the circuit of FIG. 1.

A circuit for implementing the system shown in the block diagram of FIG. 1 is shown in FIG. 3. In it, functionally corresponding electronic elements are provided with identical reference symbols. The signals c, d, f and e shown in FIG. 2 occur in inverted form in this circuit; they are marked $\overline{c}$, $\overline{d}$, $\overline{f}$ and $\overline{e}$ in FIG. 3.

The integrator 2 shown in FIG. 3 consists, in a manner well known in the art, of an operational amplifier 16, a feedback capacitor 17 for the integrating function, and a series input resistor 18. A transistor 19, shunted across integration capacitor 17 serves as an electronic switch for short circuiting the capacitor for the duration of each synchronizing pulse delivered by the timer, thereby discharging it.

In the embodiment of FIG. 3, timer 3 consists of two npn transistors 20 and 21, the collectors of which are connected, via resistors 22 and 23, to the positive supply voltage $+U_B$ and emitters of which are grounded. The collector of transistor 20 is connected to the base of transistor 21 via a resistor 24. The series-connected base resistor 25 forming the input of transistor 20 in timer 3 is supplied, as the control voltage, with a full-wave rectified AC line voltage $U_{Netz=}$ having a small negative DC voltage superimposed. For the time intervals when negative control voltage is applied to transistor 20, i.e., at time intervals corresponding to a half-cycle, short rectangular pulses appear at the collector of transistor 20. These synchronizing pulses are available at the collector of transistor 21 in inverted form and are fed via base resistor 26 to the base of pnp transistor 19. The base of transistor 19 is also connected to negative supply voltage $-U_B$ via resistor 27.

First and second limit detectors 6 and 14 are made up of operational amplifiers 28 and 29, respectively, having associated external resistors 30, 31 and 32, 33 and appropriate reference limit voltages $-U_{Ref}$ and $+U_{Ref}$ as shown in FIG. 3. The outputs of operational amplifiers 28 and 29 are connected to a diode 36 via a gate composed of diodes 34 and 35, diode 36 being connected to one input of NOR gate 8, the first conjunctive logic element.

The counter 9 and gate circuit 5 require no further explanation, since they were fully illustrated and described in connection with FIG. 1.

For the series circuit of limit detector 15 and the astable multivibrator employed as pulse generator 10 of FIG. 1, a particularly simple possible implementation is depicted in FIG. 3, using operational amplifier 37. The output of operational amplifier 37 is connected to the anodes of two diodes 38 and 39 whose cathodes are connected, via resistors 40 and 41, to the inputs of the operational amplifier. The non-inverting input of amplifier 37 is also connected, via resistor 42, to the negative reference voltage $-U_{Ref}$; the inverting input of amplifier 37 is tied, via the resistor 43, to the output of integrator 2. The inverting input of amplifier 37 is also connected to ground via capacitor 44.

When the output signal of integrator 2 is smaller than the negative reference voltage $U_{Ref}$, the output of operational amplifier 37 is negative and no positive or negative feedback via the resistors 40 and 41 can occur, because of the blocking action of diodes 38 and 39. This is the case when the output signal of integrator 2 is below the limit g3.

If, however, the level of the output signal of integrator 2 becomes larger than the negative reference voltage $-U_{Ref}$, the output of operational amplifier 37 becomes positive. Instant positive feedback takes place via the resistor 41, and negative feedback via the resistor 40; in the process, capacitor 44 draws charging current. At this time, the non-inverting input of operational amplifier 37 is more positive than the inverting input. Resistors 42 and 43 are proportioned so that the inverting input can become more positive than the non-inverting input. When the capacitor 44 is fully charged, the inverting amplifier input is more positive than the non-inverting one. When the voltage at the inverting input, which is rising with the charging of the capacitor 44, reaches the level of the voltage at the non-inverting input, the output of the operational amplifier 37 becomes negative, and positive and negative feedback via diodes 38 and 39 is not possible. Capacitor 44 now discharges via resistor 43 and the inverting input again becomes more negative than the non-inverting input. The output of operational amplifier 37 then jumps to a positive voltage value. This results, then, in the appearance of a rectangular voltage signal at the output of the operational amplifier 37, the frequency of which is determined by capacitor 44 and resistors 40 and 43. This output signal, which has a relatively high frequency, is coupled via blocking diode 45 directly to the input of conjunctive logic element 8 which receives the other limit detector outputs. Therefore, if the output voltage of integrator 2 exceeds the limit g3, a signal with a frequency high in comparison to the frequency of the synchronizing pulses is fed to counter 9 and the preset counter reading is quickly reached.

What is claimed is:

1. A circuit arrangement having a squarer and an integrator coupled thereto for monitoring the square of the RMS value of a periodic input signal coupled to said squarer comprising:
    timing means supplying synchronizing pulses at intervals separated by one period of the periodic input signal for resetting the integrator;
    a first limit detector, coupled to the integrator, for generating a pulse when its limit is exceeded by the output signal of the integrator;
    a counter, whose input is coupled to the limit detector via a first conjunctive logic element, for delivering, upon reaching a preset count, a continuous signal to an indicator for activating it and to the first conjunctive element; and
    a gate circuit for feeding reset pulses to the reset input of the counter at the rate of the synchronizing pulses and for blocking delivery of the reset pulses so long as the first limit indicator delivers a pulse at every periodic time interval or when the preset count is reached in the counter.

2. A circuit arrangement in accordance with claim 1 for input signals produced by phase gating an AC voltage, further comprising the timing means delivering a synchronizing pulse at every zero crossing.

3. A circuit arrangement in accordance with claim 1 in which:
    each pulse generated by the first limit indicator is present so long as the limit is exceeded;
    the gate circuit comprises a JK storage member and a second conjunctive logic element;
    synchronizing pulses from the timing means are supplied to the clock input of the JK storage member;
    the signal which is supplied to the input of the first conjunctive logic element from the limit detector is fed to the enable input on the resetting side of the JK storage member via an inverter and to the enable input on the setting side of the JK storage member;
    the output of the setting side of the JK storage member is coupled to an inverting input of a second conjunctive logic element, and the synchronizing signal is coupled to the other input, the output of the logic element comprising the output of the gate circuit.

4. A circuit arrangement in accordance with claim 3 further comprising:
    a second limit detector coupled to the output of the squarer; and
    a disjunctive logic element, coupled to the outputs of the first and second limit detectors, the output of which is coupled to the first conjunctive logic element.

5. A circuit arrangement in accordance with claim 4, further comprising:
    a third limit detector, whose limit is above that of the first limit detector, coupled to the output of the integrator; and
    a pulse generator connected to the third limit detector for generating repetitive output signals in response to the output of the pulse generator and for feeding them to an input of first conjunctive logic element, the repetitive signals having a frequency considerably higher than that of the synchronizing pulses.

6. A circuit arrangement in accordance with claim 5, in which the pulse generator is an astable multi-vibrator.

7. A circuit arrangement in accordance with one of the claims 1 to 6, in which the integrator is an operational amplifier having an integration capacitor bridging the inverting input and the output, the capacitor having a shunt-connected electronic switch which is closed by synchronizing pulses from the timer.

8. A circuit arrangement in accordance with claim 6, in which the series circuit of the third limit detector and the pulse generator comprises an operational amplifier, whose output is fed back to both inputs by series circuits each consisting of a diode and a resistor, whose inverting input is coupled by another resistor to the output of the integrator and by a capacitor to ground, and whose non-inverting input is connected via a resistor to a negative reference voltage ($-U_{Ref}$), the resistors being proportioned so that, after the capacitor is charged, a more positive voltage is present at the inverting input.

* * * * *